(12) United States Patent
Czarnecki

(10) Patent No.: US 7,540,767 B1
(45) Date of Patent: Jun. 2, 2009

(54) PLUG-IN AMP/WATT POWER METER

(75) Inventor: Neil A. Czarnecki, Mt. Pleasant, WI (US)

(73) Assignee: Reliance Controls Corporation, Racine, WI (US)

( * ) Notice: Subject to any disclaimer, the term of this patent is extended or adjusted under 35 U.S.C. 154(b) by 0 days.

(21) Appl. No.: 11/844,813

(22) Filed: Aug. 24, 2007

Related U.S. Application Data

(60) Provisional application No. 60/823,588, filed on Aug. 25, 2006.

(51) Int. Cl.
*H01R 33/945* (2006.01)
(52) U.S. Cl. .................. 439/517; 439/488; 439/502; 320/114
(58) Field of Classification Search ............. 439/488, 439/502–505, 517; 320/111, 114, 115
See application file for complete search history.

(56) References Cited

U.S. PATENT DOCUMENTS

| | | | |
|---|---|---|---|
| 4,097,843 A | 6/1978 | Basile | |
| 4,120,031 A | 10/1978 | Kincheloe et al. | |
| 4,331,122 A | 5/1982 | Sohner et al. | |
| 4,816,746 A | 3/1989 | Peak | |
| 4,829,289 A | 5/1989 | Kallman et al. | |
| 4,901,007 A * | 2/1990 | Sworm | 324/110 |
| 5,225,816 A | 7/1993 | Lebby et al. | |
| 5,424,903 A * | 6/1995 | Schreiber | 361/166 |
| 5,793,352 A * | 8/1998 | Greenberg et al. | 345/699 |
| 6,095,850 A * | 8/2000 | Liu | 439/488 |
| 6,555,990 B1 * | 4/2003 | Yang | 320/113 |

FOREIGN PATENT DOCUMENTS

JP        0038587        3/1979

* cited by examiner

*Primary Examiner*—Khiem Nguyen
(74) *Attorney, Agent, or Firm*—Boyle Fredrickson, S.C.

(57) ABSTRACT

A power meter has a measuring circuit composed entirely of analog components that measures the instantaneous current draw of one or more electrical devices, such as home appliances. The power meter may be in the form of a hand-held device that includes elongated connections that allow a homeowner to measure the current draw of an electrical device without significant displacement of the electrical device. In addition to measuring current draw, the power meter may provide an estimated wattage consumed by the measured electrical devices.

18 Claims, 4 Drawing Sheets

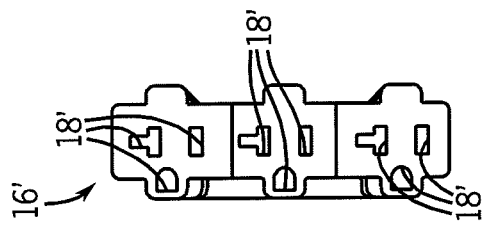
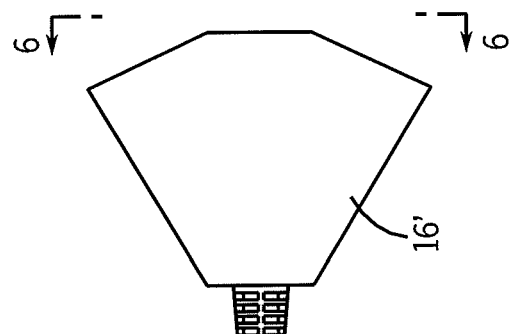
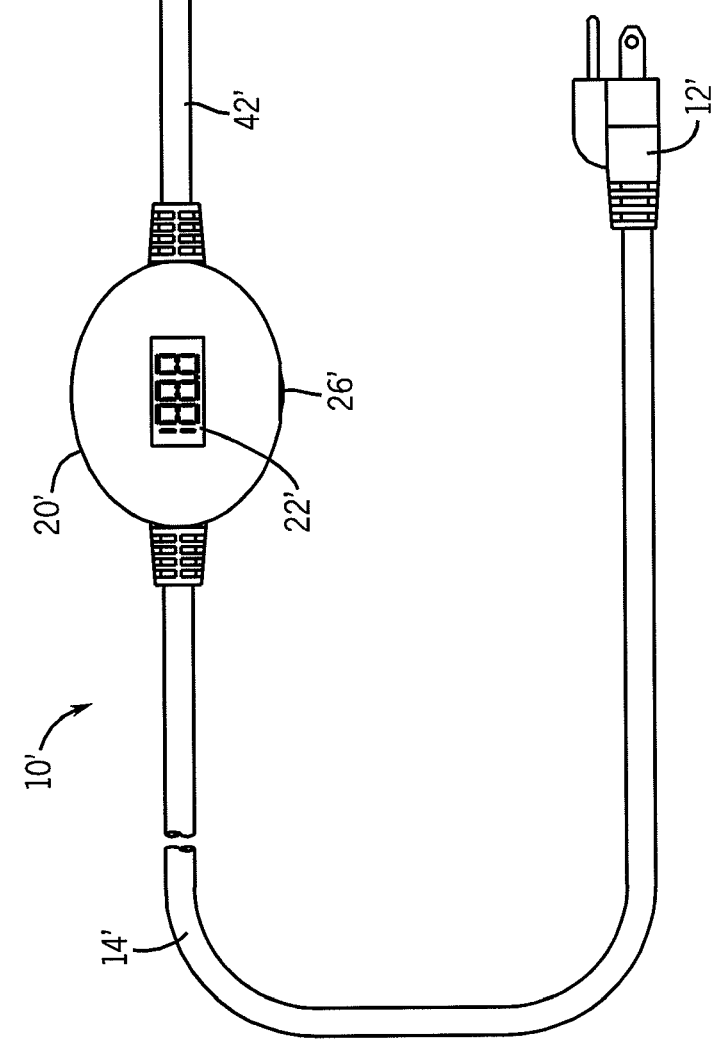

PLUG-IN AMP/WATT POWER METER

CROSS REFERENCE TO RELATED APPLICATION

The present application claims the benefit of U.S. Ser. No. 60/823,588, filed Aug. 25, 2006, the disclosure of which incorporated herein by reference.

BACKGROUND OF THE INVENTION

The present invention relates to power meters and, more particularly, to a power meter to which the collective current draw of multiple loads is measured using a measuring circuit composed entirely of analog components.

Whether it be as a matter of general interest or to determine the size needed for an auxiliary power supply, such as an electric generator, homeowners are increasingly interested in the energy use associated with the electric load of the home and, more particularly, of selected electrical loads. The total electrical load of a home may be determined through monitoring the utility power meter typically located exteriorly of the home. However, determining the electrical load, i.e., current draw, of selected electrical loads is more difficult.

One approach is to electrically isolate all loads except those to be tested and then visually inspect the utility power meter. A drawback of such an approach is that all loads not to be measured, of which there may be dozens for a single home, must be electrically isolated. Alternately, the circuit breakers for the circuit branches loaded by the electrical devices not to be measured may be thrown OFF. In the case of the latter, the homeowner would still be required to electrically isolate loads of a given circuit branch if other electrical devices that load the given circuit are to be measured. Regardless of which approach is taken, it can be time-consuming to electrically isolate the appropriate electrical devices. Moreover, if the homeowner wanted to measure the energy usage over time, the electrical isolation would be required throughout the measurement interval, which may be undesirable and impractical.

As such, a number of in-line power meters have been designed that allow current to be supplied to an electrical device through the power meter itself when interconnected between a wall outlet and the electrical device. These devices typically include rather complex digital circuits that measure various electrical parameters associated with the energy usage of an electrical device, such as an appliance. These parameters include instantaneous values, such as instantaneous current, as well as time-based values, such as average current. Moreover, some power meters may be programmed to include cost information associated with energy usage so that a homeowner can monitor the cost of the energy usage of a given electrical device.

These conventional power meters, which can be quite costly to the consumer because of the complexity of the measuring circuitry and the functionality provided, are designed to be wall-connected devices. That is, the power meter will include a back-mounted electrical plug that plugs into a conventional wall outlet. The power meter will also include a single front mounted outlet into which the electrical plug of an electrical device to be measured can be plugged. Outside their cost, these conventional power meters are generally practical if the outlet to which the power meter is connected is accessible and viewable.

For example, most homeowners connect the power cord of a refrigerator to a wall outlet that is positioned behind the refrigerator. Thus, to make use of a conventional power meter, the homeowner would be required to wheel the refrigerator away from the wall a sufficient distance for the homeowner to connect the power meter. To be able to read the power meter, the homeowner would also be required to wheel the refrigerator out a sufficient distance so that the display panel of the power meter could be viewed. For a typical refrigerator, this may require that the homeowner wheel the refrigerator several feet away from the wall outlet. To measure the energy usage over time and be able to visually read the display panel, the homeowner would be need to keep the refrigerator wheeled away from the wall outlet or wheel the refrigerator away each time the homeowner desired to read the power meter.

Another drawback of conventional power meters is that a single outlet is provided for connecting a single electrical device to the power meter. To measure the electrical usage of multiple electrical devices requires the homeowner to connect each of the electrical devices to a multi-outlet receptacle and then connect multiple electrical devices to the multi-outlet receptacle. The power meter may measure the collective energy usage, but the power meter would have to be positioned in sufficient proximity to all of the electrical devices to be measured. Alternately, multiple extension cords could be used to link the electrical devices to the wall-mounted power meter with the additional cost and disruption associated with multiple extension cords strewn about the home.

BRIEF DESCRIPTION OF THE INVENTION

The present invention is directed to a power meter having a measuring circuit composed entirely of analog components that measures the instantaneous current draw of one or more electrical devices, such as home appliances. The power meter may be in the form of a hand-held device, which includes elongated connections that allow a homeowner to measure and monitor a value of the current draw of an electrical device without significant displacement of the electrical device. In addition to measuring current draw, the power meter may measure an estimated wattage consumed by the measured electrical devices. Since the measuring circuit lacks any digital circuitry, such as microprocessors, the power meter may be light, small, and highly portable while providing a cost savings relative to predecessor digital-based power meters.

In one aspect of the invention, a power meter includes a plug insertable into a conventional outlet and a receptacle adapted to receive one or more plugs extending from various electrical appliances or other loads. Between the plug and the receptacles, the power meter includes an analog measuring circuit that can modify the electrical signal passing through the measuring device to determine the amperage drawn or watts consumed by the electrical device(s) connected to the power meter. This measured or determined value for the particular electrical parameter is then displayed by the power meter in a manner that can be readily viewed by a homeowner or other user.

In accordance with a further aspect, the invention contemplates a power meter that includes a housing and a current measuring circuit disposed in the housing. The power meter further includes a first cord extending from the housing and electrically connected to the measuring circuit. The first cord has a plug adapted to engage a conventional electrical outlet. The power meter further includes a receptacle formed in the housing and electrically connected to the current measuring circuit, wherein the receptacle is adapted to receive a conventional three-prong plug of an electrical device.

According to another aspect of the invention, the present invention contemplates a power meter that includes a plug adapted to be engaged with a conventional electrical outlet and an outlet adapted to receive a plug of an electrical device. A measuring circuit composed entirely of analog components and electrically interconnected between the plug and the outlet is adapted to measure an instantaneous current draw of the electrical device.

Numerous other aspects, features, and advantages of the present invention will be made apparent from the following detailed description together with the drawing figures.

BRIEF DESCRIPTION OF THE DRAWINGS

The drawings illustrate the best mode currently contemplated of practicing the present invention.

In the drawings:

FIG. 5 is an elevation view of another embodiment of a power meter according to the present invention; and FIG. 6 is an end view of a portion of the power meter shown in FIG. 5.

DETAILED DESCRIPTION OF THE INVENTION

Figure 1:
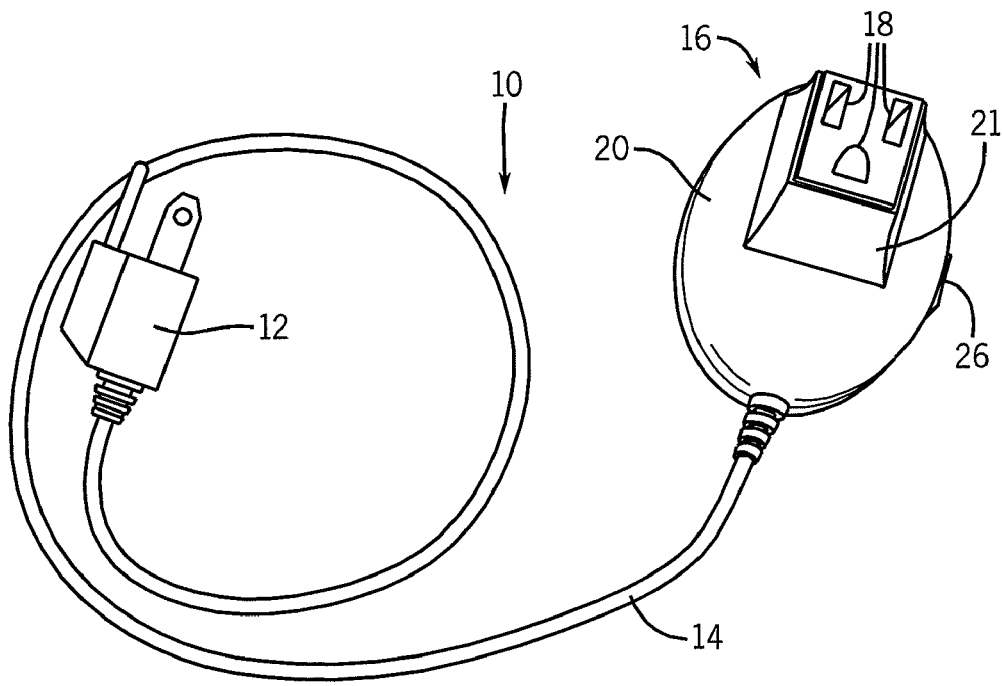
FIG. 1 is a rear perspective view of a plug-in power meter constructed according to one embodiment the present invention.

With regard now to the drawing figures in which like reference numerals designate like parts throughout the disclosure, a plug-in power meter constructed according to a first embodiment of the present invention is indicated generally at 10 in FIG. 1. The power meter 10 includes a plug 12 disposed at one end that may be engaged with a conventional electrical outlet (not shown), and a cord 14 extending outwardly from the plug 12. The cord 14 contains conductive wires (not shown) that enable electrical power to be supplied from the outlet to which the plug 12 is connected, through the cord 14 to a receptacle 16 attached to the cord 14 opposite the plug 12. The receptacle 16 includes a number of openings 18 in a configuration similar to that of a conventional outlet, such that a plug (not shown) connected to a suitable electric device or appliance (not shown), such as a furnace, air conditioner, sump pump, microwave oven, refrigerator, freezer, toaster, coffee maker, computer, radio, and the like, can be inserted into the openings 18 in order to connect the device or appliance to the outlet using the power meter 10, such that the device or appliance can be operated on power supplied through the power meter 10.

The receptacle 16 also includes a housing 20 in which the openings 18 are formed. The housing 20 can include an extension 21 projecting outwardly from the housing 20 and in which the openings 18 are disposed. The openings 18 are electrically connected to a measuring circuit 24 (best shown in FIG. 4) such that, when power is supplied to the device or appliance through engagement of the plug within the openings 18, the electrical power passes through the measuring circuit 24 for measurement of the desired electrical parameter.

Figure 2:
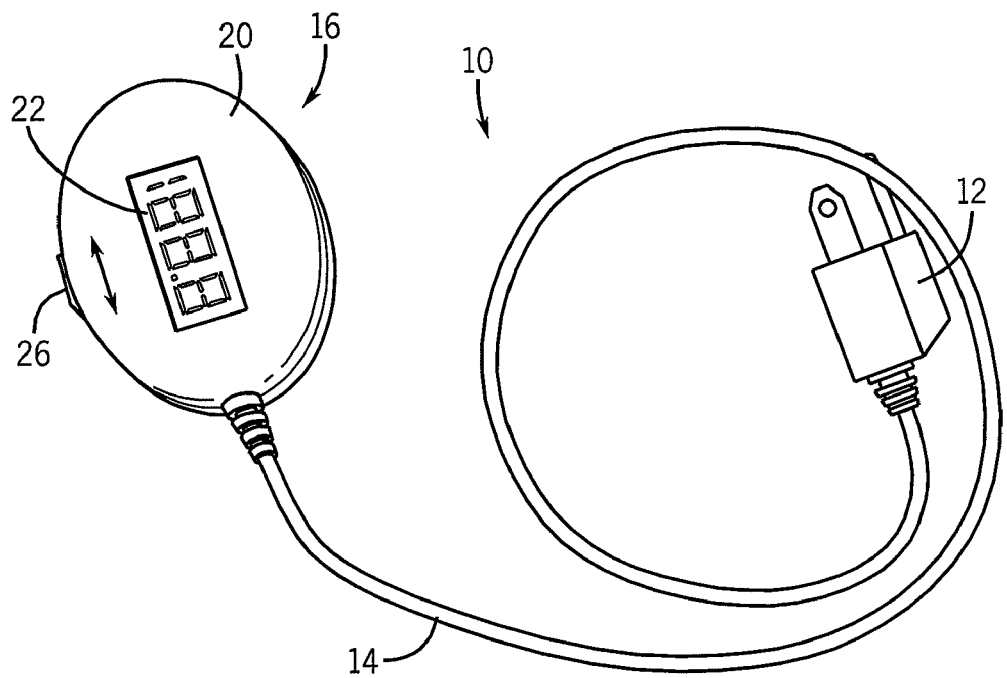
FIG. 2 is a front perspective view of the power meter of FIG. 1.
Figure 3:
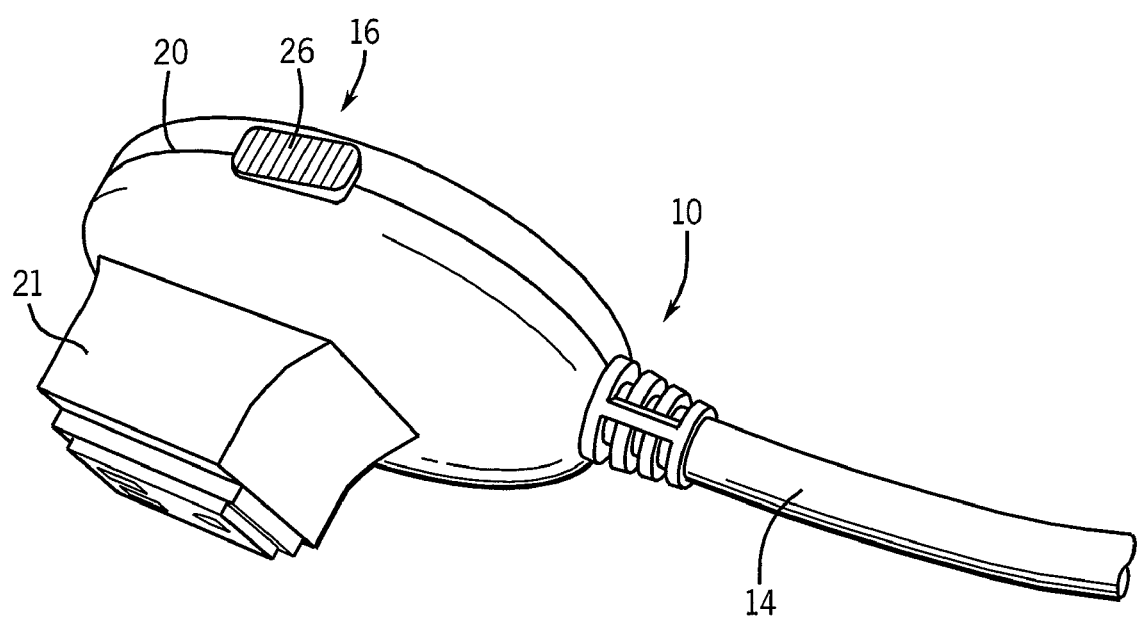
FIG. 3 is a side perspective view of the power meter of FIG. 1.

As best shown in FIG. 2, the housing 20 also includes a display 22 generally opposite the openings 18. The display 22 is also operably connected to the measuring circuit 24 such that the value for an electrical parameter as measured or determined by the circuit 24 can be represented on the display 22. As best shown in FIG. 3, a switch 26 is located on the housing 20, preferably on one side of the housing 20 between the openings 18 and the display 22. The switch 26 is also operably connected to the measuring circuit 24 and selectively changes the mode of operation of the circuit 24, such that the circuit 24 can measure and display one of two electrical parameters that can be determined by the measuring circuit 24. For example, in one embodiment, the switch 26 toggles the power meter between measuring current (amperage) draw and power (wattage) consumption of the connected electrical devices.

Figure 4:
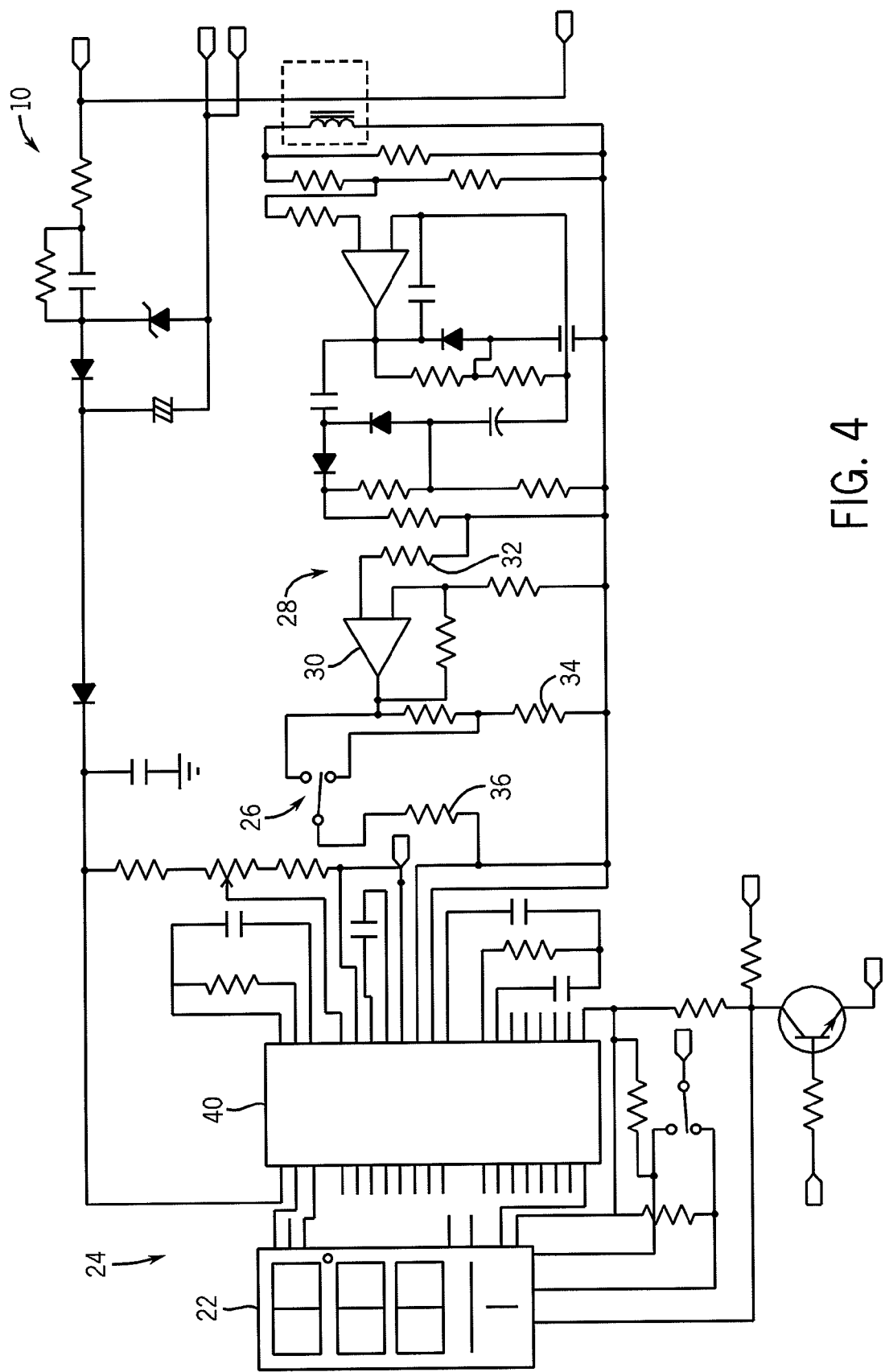
FIG. 4 is a circuit diagram of the power meter of FIG. 1.

Referring now to FIG. 4, an exemplary circuit configuration 24 for the power meter 10 includes an amperage measuring circuit 28 that is connected to the power source or outlet via the plug 12, and to the electrical device that is to be tested via the openings 18. The amperage drawn by the appliance when operated is measured in an analog fashion by an amplifier 30 and resistors 32-38. The measured or determined value for the amperage is then directed to an analog-to-digital converter 40 that functions only as a driver for the display 22. That is, the converter 40 does not form part of the amperage/wattage measuring circuit 28. The signal received by the converter 40 is converted into a format that can readily be represented on the display 22 to illustrate the amperage or wattage value of the device or appliance plugged into the power meter 10. When the switch 26 is in the proper position to indicate that the value for the amperage drawn by the appliance is to be represented, this value is illustrated in a readable manner on the display 22.

Alternatively, when the switch 26 is moved to the position indicating that the value for the watts consumed by the electrical device is to be represented on the display 22, the measuring circuit 24 arrives at this value by altering, or multiplying the measured or determined amperage value by a factor of 120 to provide an estimated value for the watts being drawn by the device or appliance being tested. More particularly, when switch 26 is moved to the "WATT" position, the output of the amplifier 30 is presented across a feedback loop comprised generally of resistors 34, 36. This causes the gain of the amplifier 30 to be changed from a unity gain to a gain factor of 120. In other words, the measured current draw is multiplied by the amplifier by 120 to provide an estimated power consumption for the connected electrical devices. One skilled in the art will appreciate that the gain factor of the amplifier may be varied by selecting a resistor 36 with different impedance. Preferably, the value of resistors 32, 34 should be equal so that the amplifier 30 has a unity gain when switch 26 is the "AMP" position.

One skilled in the art will appreciate that the exemplary circuit shown in FIG. 4 includes additional electronic components that provide line buffering and conditioning not specifically described herein. Additionally, one skilled in the art will appreciate that other circuit configurations using electronic components other than those shown in the circuit are possible and considered within the scope of the present invention.

In a second embodiment on the present invention as shown in FIGS. 5-6, in which like components are designated with primed reference characters, the power meter 10' includes the plug 12', the cord 14', and the housing 20' with the display 22' and the switch 26' as in the previous embodiment. The cord 14' is preferably formed to have a length similar to that for a normal extension cord. However, the power meter 10' also includes a second cord 42' that extends away from the housing 20' opposite the cord 12' to a receptacle 16'. It is understood that either of the cords 14' or 42' may have any desired length. The receptacle 16' includes multiple sets of openings 18' in the configuration of a conventional electrical outlet, such that multiple plugs from multiple electric devices or appliances can be simultaneously connected to the receptacle 16' for determining a combined amperage or wattage for all of the appliances when in operation. Additionally, the receptacle 16' can include a selector device (not shown) that enables the power meter 10' to determine the amperage or watt value for any combination of the appliances connected to the receptacle 16'.

Various additional embodiments of the present invention are contemplated as being within the scope of the following claims particularly pointing out and distinctly claiming the subject matter regarded as the invention.

I claim:

1. A power meter comprising:
   a plug adapted to be engaged with a conventional electrical outlet;
   a plurality of receptacles, each adapted to receive a respective plug from a respective electrical device; and
   an analog measuring circuit connected between the plug and the plurality of receptacles, the measuring circuit including an amplifier and a switch operably connected to the amplifier, the switch operable to change the operation of the amplifier and the measuring circuit to determine an instantaneous current or wattage draw for any electrical devices connected to the plurality of receptacles.

2. The power meter of claim 1 further comprising a cord interconnected between the plug and the measuring circuit.

3. The power meter of claim 1 further comprising a cord interconnected between the plurality of receptacles and the measuring circuit.

4. The power meter of claim 3 wherein the measuring circuit is disposed in a housing remote from the plug and the plurality of receptacles.

5. The power meter of claim 4 wherein the housing has an outlet electrically connected to the measuring circuit and wherein the cord has an interface adapted to be engaged with the outlet.

6. The power meter of claim 5 wherein the cord is fixedly connected to the plurality of receptacles and the interface is adapted to be repeatedly engaged with and disengaged from the outlet.

7. The power meter of claim 6 wherein the electrical outlet is adapted to receive a plug of a single electrical device when the interface is disengaged from the outlet.

8. The power meter of claim 1 further comprising a display adapted to display a value for the total and instantaneous current draw.

9. The power meter of claim 1 wherein the measuring circuit is disposed in a housing that is adapted to be hand held when determining the instantaneous current draw of any electrical devices connected to the plurality of receptacles.

10. A power meter comprising:
    a housing;
    an analog measuring circuit disposed in the housing, the measuring circuit including an amplifier and a switch operably connected to the amplifier, the switch operable to change the operation of the amplifier and the measuring circuit to measure different electrical parameters;
    a first cord extending from the housing and electrically connected to the measuring circuit, and having a plug adapted to engage a conventional electrical outlet; and
    a receptacle formed in the housing and electrically connected to the current measuring circuit, the receptacle adapted to receive a conventional plug of an electrical device.

11. The power meter of claim 10 further comprising a second cord detachably connected to the receptacle and including a plurality of receptacles for engaging with plugs of a plurality of electrical devices.

12. The power meter of claim 10 further comprising a display screen formed in the housing and an A/D converter linked between the measuring circuit and the display screen.

13. The power meter of claim 10 wherein the first cord is fixedly connected to the housing.

14. A power meter comprising:
    a plug adapted to be engaged with a conventional electrical outlet;
    an outlet adapted to receive a plug of an electrical device;
    a measuring circuit composed entirely of analog components and including an amplifier, the measuring circuit electrically interconnected between the plug and the outlet and adapted to measure various electrical parameters for the electrical device connected to the outlet; and
    a switch operably connected to the amplifier to change the operation of the amplifier and the measuring circuit to measure different electrical parameters.

15. The power meter of claim 14 further comprising an extension cord having a prong arrangement adapted to engage with the outlet and having a plurality of receptacles adapted to receive plugs of a plurality of electrical devices.

16. The power meter of claim 15 wherein the plurality of receptacles includes three receptacles.

17. The power meter of claim 14 further comprising a display adapted to display a digital representation of a numeric value of the instantaneous current and an A/D converter for driving the display and interconnected between the measuring circuit and the display.

18. A power meter comprising: an interface adapted to be engaged with a conventional electrical outlet; at least one receptacle adapted to receive a plug from a electrical device; and an analog measuring circuit connected between the plug and the at least one receptacle, the measuring circuit including a switch operable to change the operation of the measuring circuit to determine different electrical parameters for an electrical device connected to the at least one receptacle; wherein the measuring circuit includes an amplifier operably connected to the switch, and wherein the switch is operable to alter the operation of the amplifier to measure different electrical parameters for the electrical device connected to the at least one receptacle.

* * * * *